(12) United States Patent
Chuang et al.

(10) Patent No.: US 9,613,996 B2
(45) Date of Patent: Apr. 4, 2017

(54) BACKSIDE STRUCTURE AND METHODS FOR BSI IMAGE SENSORS

(71) Applicant: Taiwan Semiconductor Manufacturing Company, Ltd., Hsin-Chu (TW)

(72) Inventors: Chun-Chieh Chuang, Tainan (TW); Dun-Nian Yaung, Taipei (TW); Jen-Cheng Liu, Hsin-Chu (TW); Wen-De Wang, Minsyong Township (TW); Keng-Yu Chou, Kaohsiung (TW); Shuang-Ji Tsai, Tainan (TW); Min-Feng Kao, Chiayi (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/218,266

(22) Filed: Jul. 25, 2016

(65) Prior Publication Data
US 2016/0336367 A1 Nov. 17, 2016

Related U.S. Application Data

(60) Division of application No. 14/280,379, filed on May 16, 2014, now Pat. No. 9,401,380, which is a continuation-in-part of application No. 14/178,084, filed on Feb. 11, 2014, now Pat. No. 8,969,991, which is a division of application No. 13/620,016, filed on Sep. 14, 2012, now Pat. No. 8,709,854.

(60) Provisional application No. 61/645,376, filed on May 10, 2012.

(51) Int. Cl.
H01L 21/00 (2006.01)
H01L 27/146 (2006.01)

(52) U.S. Cl.
CPC .... *H01L 27/14623* (2013.01); *H01L 27/1462* (2013.01); *H01L 27/1464* (2013.01); *H01L 27/14645* (2013.01); *H01L 27/14685* (2013.01); *H01L 27/14689* (2013.01)

(58) Field of Classification Search
None
See application file for complete search history.

(56) References Cited

U.S. PATENT DOCUMENTS

| 7,772,664 | B2 | 8/2010 | Min et al. |
| 8,709,854 | B2 | 4/2014 | Chuang et al. |
| 8,969,991 | B2 | 3/2015 | Chuang et al. |
| 2003/0032260 | A1 | 2/2003 | Ahn et al. |
| 2004/0021939 | A1 | 2/2004 | Kobayashi |
| 2005/0122417 | A1 | 6/2005 | Suzuki |
| 2009/0189235 | A1 | 7/2009 | Ikeda et al. |

(Continued)

FOREIGN PATENT DOCUMENTS

| JP | 2009252949 | 10/2009 |
| JP | 2011151126 | 8/2011 |

(Continued)

*Primary Examiner* — Reema Patel
(74) *Attorney, Agent, or Firm* — Slater Matsil, LLP (57) ABSTRACT

A back side image sensor and method of manufacture are provided. In an embodiment a bottom anti-reflective coating is formed over a substrate, and a metal shield layer is formed over the bottom anti-reflective coating. The metal shield layer is patterned to form a grid pattern over a sensor array region of the substrate, and a first dielectric layer and a second dielectric layer are formed to at least partially fill in openings within the grid pattern.

20 Claims, 9 Drawing Sheets

(56) References Cited

U.S. PATENT DOCUMENTS

| | | |
|---|---|---|
| 2009/0251573 A1 | 10/2009 | Toyoda |
| 2009/0283909 A1 | 11/2009 | Tsutsumi et al. |
| 2010/0201834 A1 | 8/2010 | Maruyama et al. |
| 2010/0244173 A1 | 9/2010 | Wang et al. |
| 2010/0304520 A1 | 12/2010 | Hiyama |
| 2011/0164159 A1 | 7/2011 | Ohgishi |
| 2011/0175187 A1 | 7/2011 | Ueno et al. |
| 2012/0001286 A1 | 1/2012 | Yoon |
| 2012/0062777 A1 | 3/2012 | Kobayashi et al. |
| 2013/0207212 A1 | 8/2013 | Mao et al. |
| 2013/0299675 A1 | 11/2013 | Yamaguchi et al. |
| 2013/0299931 A1 | 11/2013 | Chuang et al. |
| 2014/0159190 A1 | 6/2014 | Chuang et al. |
| 2014/0252523 A1 | 9/2014 | Chuang |
| 2015/0140722 A1 | 5/2015 | Chuang et al. |

FOREIGN PATENT DOCUMENTS

| | | |
|---|---|---|
| KR | 20100016308 | 2/2010 |
| KR | 1020120028799 | 3/2012 |

BACKSIDE STRUCTURE AND METHODS FOR BSI IMAGE SENSORS

PRIORITY CLAIM AND CROSS-REFERENCE

This application is a divisional of U.S. patent application Ser. No. 14/280,379, filed May 16, 2014 and entitled "Backside Structure and Methods for BSI Image Sensors," which is a continuation in part of U.S. patent application Ser. No. 14/178,084, filed Feb. 11, 2014, and entitled "Backside Structure and Methods for BSI Image Sensors," now U.S. Pat. No. 8,969,991 issued Mar. 3, 2015, which is a divisional of and claims the benefit of U.S. patent application Ser. No. 13/620,016, filed Sep. 14, 2012 and entitled "Backside Structure and Methods for BSI Image Sensors," now U.S. Pat. No. 8,709,854 issued Apr. 29, 2014, which claims the benefit of provisionally filed U.S. Patent Application No. 61/645,376, filed May 10, 2012 and entitled "Backside Structure for BSI Image Sensor," which applications are hereby incorporated herein by reference.

BACKGROUND

Back Side Illumination (BSI) images sensors such as BSI CMOS image sensors are becomingly increasingly popular because of their compatibility with conventional CMOS manufacturing processes, low cost, small size, and high performance. CMOS image sensors are replacing more traditional charge coupled device (CCD) sensors due to certain advantages, including that CMOS image sensors consume less power, are compatible with CMOS semiconductor processes, and the sensors may be integrated with additional CMOS logic devices on a single integrated circuit device. Conventional CMOS manufacturing processes, however, are not tuned for BSI image sensors and current manufacturing processes may cause less than desirable device performance, particularly on the performance criteria of quantum efficiency (QE), signal to noise ratio (SNR), and light mean value uniformity.

In forming a BSI image sensor, semiconductor processing is used to form an array of photodiodes (PDs) and the associated MOS transfer transistors in a sensor array for integrated circuit dies on a semiconductor wafer, and to form periphery circuit MOS devices such as input-output buffers in the integrated circuit dies on the semiconductor wafer. As the photodiodes are exposed to light, an electrical charge is induced in the photodiodes corresponding to the light intensity. The MOS transfer transistor may sample the charge and transfer charge to a storage node for further processing. Color pixels may be formed by placing color filters over the light sensitive CMOS circuitry.

To form the BSI image sensor, after the CMOS photodiodes and MOS transistors are formed, additional semiconductor processing is performed on the back side (the side free from metallization layers and interlayer dielectrics) of the semiconductor wafer. In conventional BSI processing, the processing includes forming a buffer oxide and a metal shield over the wafer. The buffer oxide and metal shield are then selectively removed from the sensor array area of the integrated circuit dies, while the metal shield is retained over the periphery area.

However, in the conventional semiconductor processing, an etch to remove the metal shield from the sensor array areas also removes either a portion of, or all of the buffer oxide layer. The conventional etch process results in either a non-uniform buffer oxide thickness or no oxide thickness over the sensor array areas, which negatively impacts the performance of the BSI image sensor.

BRIEF DESCRIPTION OF THE DRAWINGS

For a more complete understanding of the present embodiments, and the advantages thereof, reference is now made to the following descriptions taken in conjunction with the accompanying drawing, in which.

Corresponding numerals and symbols in the different figures generally refer to corresponding parts unless otherwise indicated. The figures are drawn to clearly illustrate the relevant aspects of the embodiments and may not be drawn to scale.

DETAILED DESCRIPTION

The making and using of illustrative example embodiments are discussed in detail below. It should be appreciated, however, that this application provides many applicable inventive concepts that can be embodied in a wide variety of specific contexts. The specific embodiments discussed herein are merely illustrative of specific ways to make and use embodiments, and do not limit either the scope of this application or of the appended claims.

Before discussing the illustrated embodiments specifically, various embodiments and advantageous features thereof will be discussed generally. For instance, advantageous features of some embodiments may include improved QE, SNR, and light mean uniformity and light value performance. Some embodiments allow fine tuning of the thicknesses of layers in the light path of the image sensor to tune the color light mean value and color ratio of the device. As illustrated below, embodiments disclosed herein provide for a relatively simple structure and low cost semiconductor processes that nonetheless provide for improved performance as discussed herein. One skilled in the art will recognize that the teachings provided herein can be readily applied to present and future generation processes for manufacturing image sensors.

Both front side illumination (FSI) and BSI image sensors are known. However, when using a FSI image sensor, the light impinging on a photodiode in the sensor must first pass through the metallization layers and the interlayer dielectric material overlying the front side of the substrate, which reduces the light level impinging on the photodiode, lowers the QE, increases the noise (lowers SNR), and generally reduces performance of the sensor device. BSI image sensors are therefore increasingly used. In a BSI image sensor such as those described in the embodiments, the light enters the semiconductor substrate from the back side, and the light impinging on the photodiodes traverses a relatively thin semiconductor layer and without having to traverse any overlying metallization layers and interdielectric layers, in sharp contrast to the FSI image sensors. Use of BSI image sensors may therefore increase image sensor performance.

Figure 1:
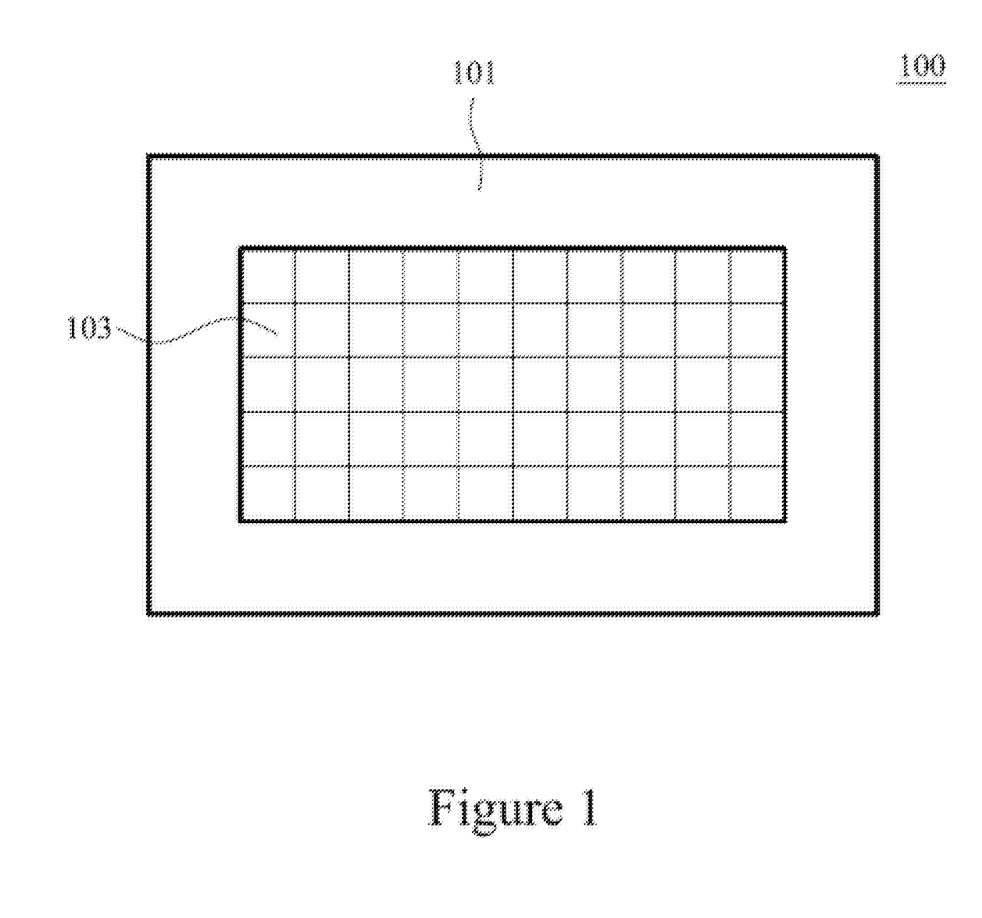
FIG. 1 depicts in a plan view a BSI image sensor device.

With reference now to the illustrative embodiments, FIG. 1 depicts in a top view a BSI image sensor 100. The image sensor 100 may be an integrated circuit including an array region of photodiodes 103 and a periphery region 101. Each photodiode 103 may include a photosensitive diode (p-n junction) and associated transistors for receiving signals proportional to the intensity or light received by the photosensitive diodes during a light sampling interval. Circuitry for providing functions other than photodiodes, such as input output buffers and logic circuitry, may be formed in the periphery region 101. This additional circuitry may include logic circuitry for operating the sensor array and circuitry for communicating the data corresponding to the sensed light to external devices. The periphery region 101 is positioned adjacent to the sensor array region 103. The integrated circuit device 100 may be formed on a semiconductor substrate such as silicon, germanium arsenide, or other semiconductor material. In an example embodiment, the integrated circuit 100 may be formed on a silicon wafer. A silicon wafer may have hundreds or thousands of image sensor integrated circuits such as 100 formed on it, using conventional semiconductor processes.

Figure 2:
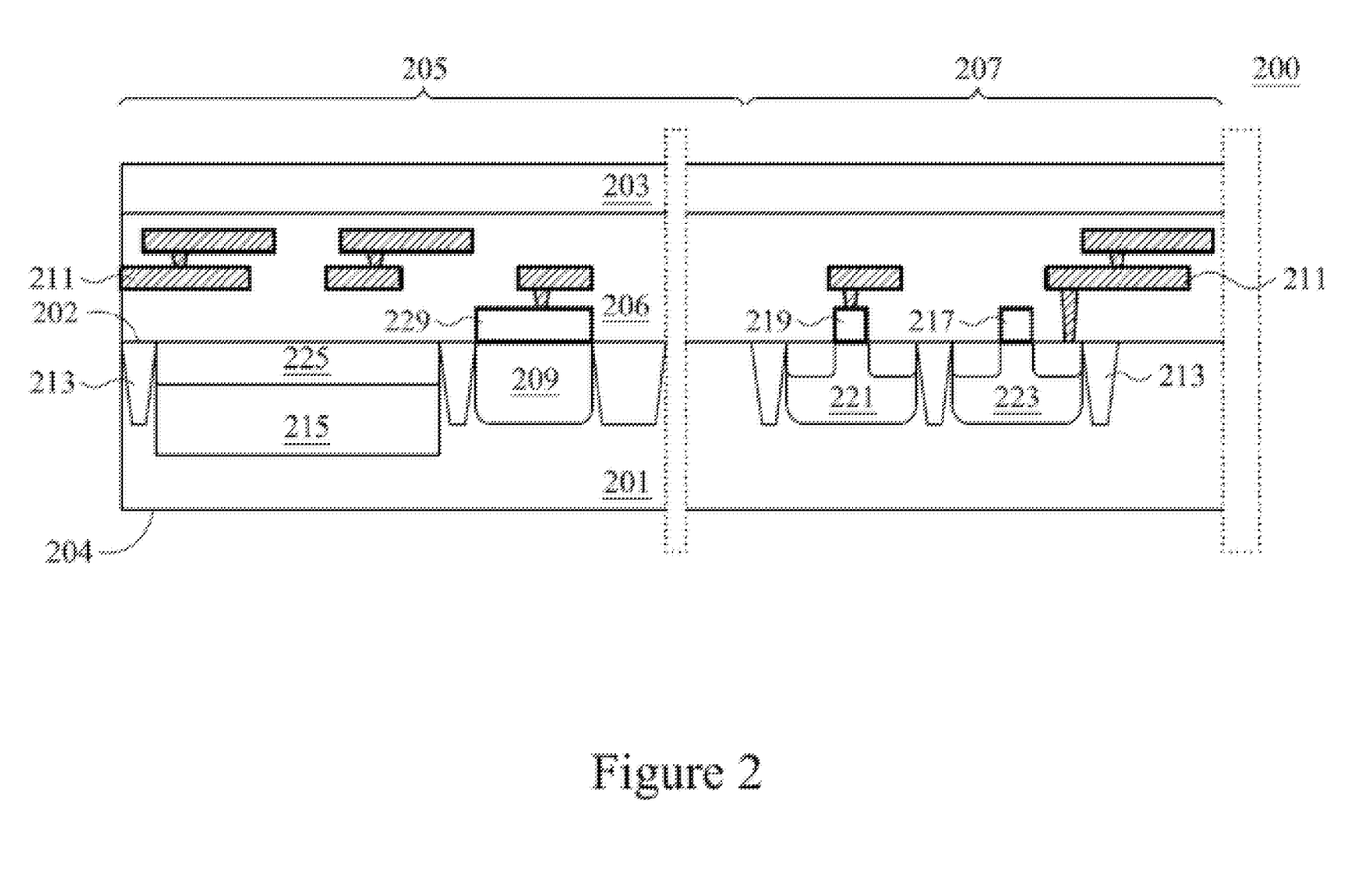
FIG. 2 illustrates in a cross sectional view an intermediate stage in the manufacture of an illustrative embodiment BSI image sensor device.

FIG. 2 shows in a cross sectional view an illustrative embodiment device 200, a BSI image sensor, at an intermediate stage of manufacture. FIG. 2 illustrates only a portion of the device 200. In a practical example, an image sensor device will include many hundreds or thousands of photodiodes in a sensor array area 205. Further, typically the device 200 is formed on a semiconductor wafer that may include many hundreds or thousands of BSI integrated circuit devices arranged as individual dies on each semiconductor wafer. Processing steps and details not useful to understanding the embodiments are omitted herein for clarity.

In the intermediate processing stage, shown in the cross section of FIG. 2, a semiconductor substrate 201 has been processed to include the sensor array region 205 and a periphery region 207, the manufacture and function of which will be clear to those skilled in the art.

In FIG. 2, semiconductor substrate 201 has a front side 202 and a back side 204. The semiconductor substrate 201 may be of a semiconductor material such as silicon, germanium, and diamond or like materials. Compound materials used for semiconductor substrates such as silicon germanium, silicon carbide, gallium arsenide, indium arsenide or indium phosphide, and combinations of these, may be used. In alternative embodiments, the substrate 201 may comprise a silicon on insulator (SOI) substrate.

As shown in FIG. 2, semiconductor substrate 201 has been processed using front end of the line (FEOL) processes to form a photodiode in a diffusion region 215 including a second diffused region 225 in the sensor array region 205. Diffused regions 221 and 223 in the periphery region 207 form doped wells that may be used, for example, to form CMOS logic transistors in the periphery region 207. Isolation structures 213 are shown between the diffused regions; these may be shallow trench isolation (STI) or LOCOS isolation. Gate structures 217, 219, and 229 may be formed as patterned gate conductors overlying the diffused regions including a gate dielectric and a conductor, and may be formed of a doped polysilicon material for example, or by using metal gate processes. The gate dielectric material (not visible) may be silicon dioxide, or high or low-k gate dielectric material. Diffused region 209 and gate 229 may form a photodiode transfer transistor. The transfer transistor may be used for transferring charge corresponding to the light sensed by the photodiode in diffusion 215 during a sampling interval into a storage node (not shown), for example. The photodiode may be formed as a diffusion region 215 of one doping type, such as an n type, and a second diffusion region of an opposing doping type 225, such a p type, to form a p-n junction for a photodiode. Pinned photodiodes may be used. The sensor array region 205 may also include pixel circuitry such as transfer gate 229, and in addition reset transistors, source follower transistors, and read select transistors for each photo detector may be formed in the sensor array region 205. Three transistor (3T) and four transistor (4T) pixel circuits, for example, may be formed with the photodiodes in the sensor array region 205.

After manufacturing the BSI array as further described below, color filters (not shown) that selectively pass light of certain frequencies which may include red, green and blue colors (R/G/B) are formed over the back side 204 of semiconductor substrate 201 over the sensor array region 205 to create color pixels. Microlens material (not shown) may be formed over the color filters to further improve the light reception. As semiconductor process technologies advance, device sizes continue to shrink, including the size of the photodiodes and thus the light sensitivity of the image sensors produced is reduced. This makes the quantum efficiency (QE) and signal to noise ratio (SNR) characteristics ever more critical. Cross-talk effects can also increase especially for longer wavelength light, such as red light. The ability to tune the light path to the photodiode enables accomplishing higher performance image sensors for various applications. Embodiments presented herein enable tuning of the layers the light path.

In FIG. 2, metallization layers 211 are shown overlying the semiconductor substrate 201 on the front side surface 202 and the metallization layers 211 are formed within a dielectric layer 206. A front side passivation layer 203 overlies the front side 202 of the substrate 201. (Note that while the front side 202 of the semiconductor substrate 201 is depicted facing upwards in the figures, the position of the substrate and the overlying layers is arbitrary in the figures, and rotating the device 200 does not change the functions and relative positions of the elements shown. As depicted in the figures, the back side 204 of the semiconductor substrate is shown oriented facing downwards; however, this does not change which portion is the back side of the device 200, even when the orientation is different.)

Figure 3:
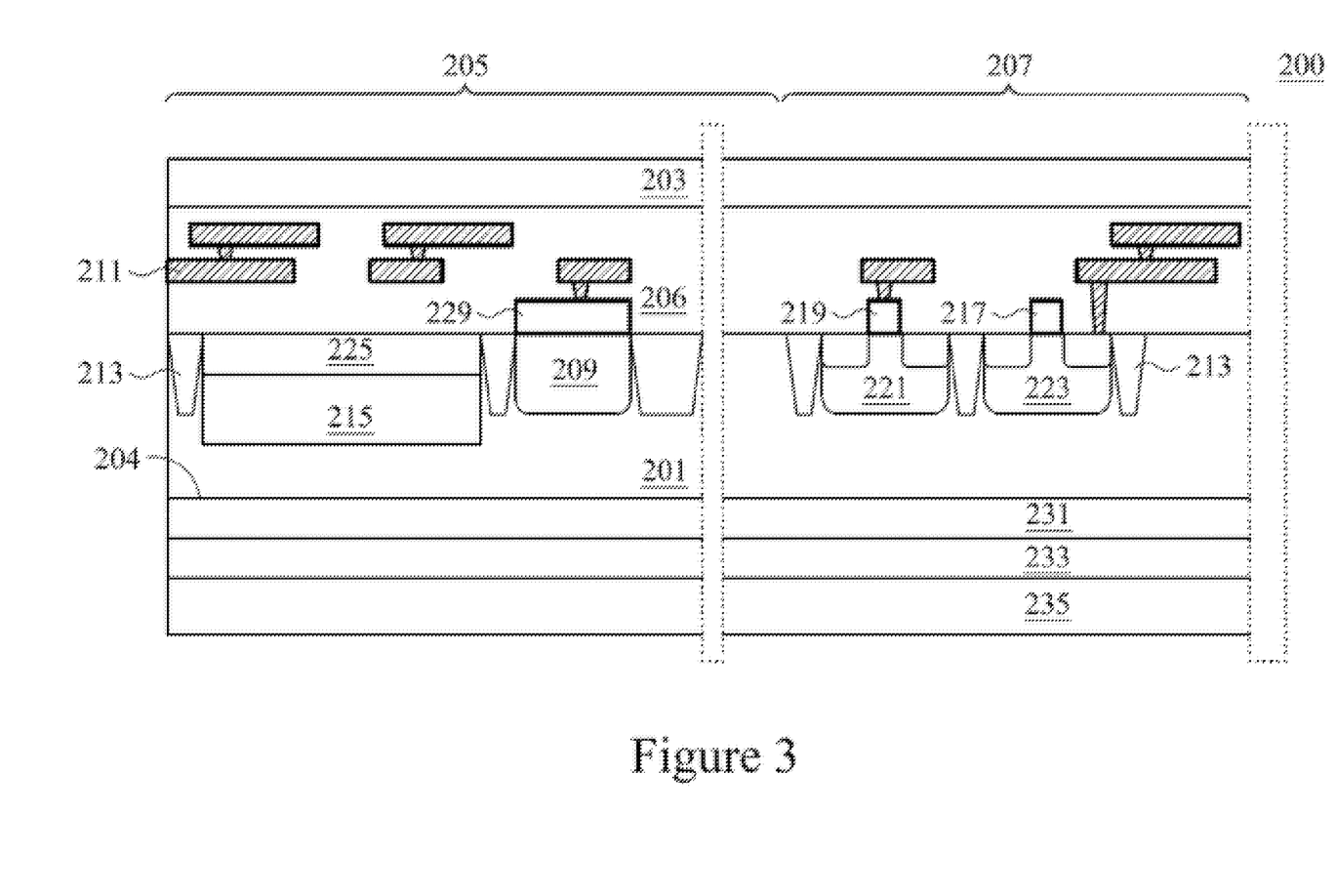
FIG. 3 illustrates in a cross sectional view the BSI image sensor device of FIG. 2 following additional processing steps.

FIG. 3 depicts the illustrative embodiment device 200 from FIG. 2 following additional processing steps. In FIG. 3, a bottom antireflective coating (BARC) layer 231 is shown formed over the back side 204 of the semiconductor substrate 201. (Note that the terms "on," "over," "above" and "like" are relative terms, regardless of whether the layers are being added to the nominal "top" of the device or to the nominal "bottom" of the device as illustrated in the figures). The BARC layer 231 may be, for example, a silicon nitride, silicon oxynitride or carbon containing layer such as silicon carbide and may be formed by CVD or PVD deposition. The BARC layer is chosen so that it may act as an etch stop layer for an overlying dielectric such as an oxide. In FIG. 3, a buffer oxide layer 233 is shown overlying the BARC layer 231. Finally, a metal shield layer 235 is formed overlying the buffer oxide layer 233. The metal shield layer 235 may be tungsten, aluminum, copper, or combinations such as AlCu. The deposition of the metal shield may be performed in a PVD process. When the device 200 is completed as further described herein, the metal shield layer 235 forms a light shield overlying the periphery region 207, so that the circuitry formed in the periphery region 207 is not exposed to light impinging on the image sensor device, thus the operation of the CMOS transistors in the periphery region 207 will not be affected by light impinging on the device 200.

Figure 4:
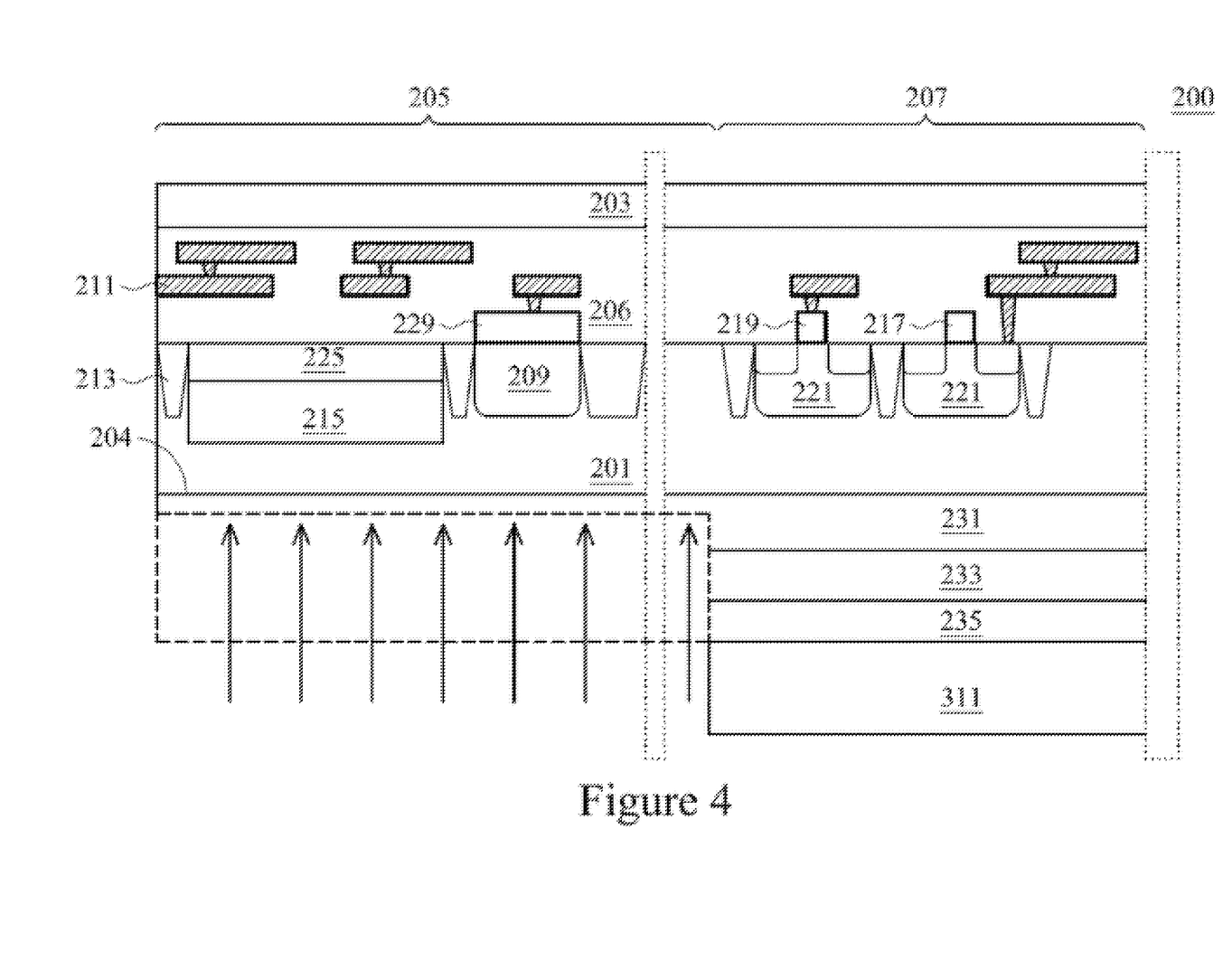
FIG. 4 illustrates in a cross sectional view the BSI image sensor device of FIG. 3 following additional processing steps.

FIG. 4 depicts, in a cross section, the embodiment image sensor device 200 during an etch process to remove certain layers over the sensor array region 205. A photoresist layer 311 is formed over the semiconductor substrate 201 and patterned by photolithography to expose the metal shield layer 235 over the sensor array region 205. The photoresist 311 remains over the periphery region 207. An etch process is used to selectively remove the metal shield 235 over the sensor array region 205, while the photoresist 311 acts as an etch mask over the periphery region 207. That is, a mask layer, such as the illustrated photoresist layer 311 or a hard mask layer or the like is formed over all or a portion of the periphery region 207, but leaves the sensor array region 205 exposed. One skilled in the art will recognize how such a mask layer can be formed and patterned in this manner. Using one or more wet and/or dry etch processes, the metal shield layer 235 and the buffer oxide layer 233 are removed in the exposed sensor array region 205, and any exposed portions of the periphery region 207. In an example embodiment, a dry etch is used. As shown in FIG. 4, the etch process also removes a portion of the exposed regions of the BARC layer 231 (i.e. those portions in the sensor array region 205 and the portion exposed in the periphery region 207). In contemplated embodiments, at least 10% of the original thickness of the BARC layer 231 will be removed in order to ensure that all remaining buffer oxide layer 233 has been removed. This is commonly referred to as an over-etch step or process. Removing a portion of the BARC layer 231 is done to completely remove the buffer oxide layer over the BARC layer in all portions of the sensor array area 205. In an example process, the etch continues until at least 10% of the original BARC layer thickness is removed. In other embodiments, more than 10% of the original BARC layer thickness may be removed by the over-etch process. The etch process also forms a vertical sidewall in the oxide layer 233 and the metal shield 235 as shown in FIG. 4.

Figure 5:
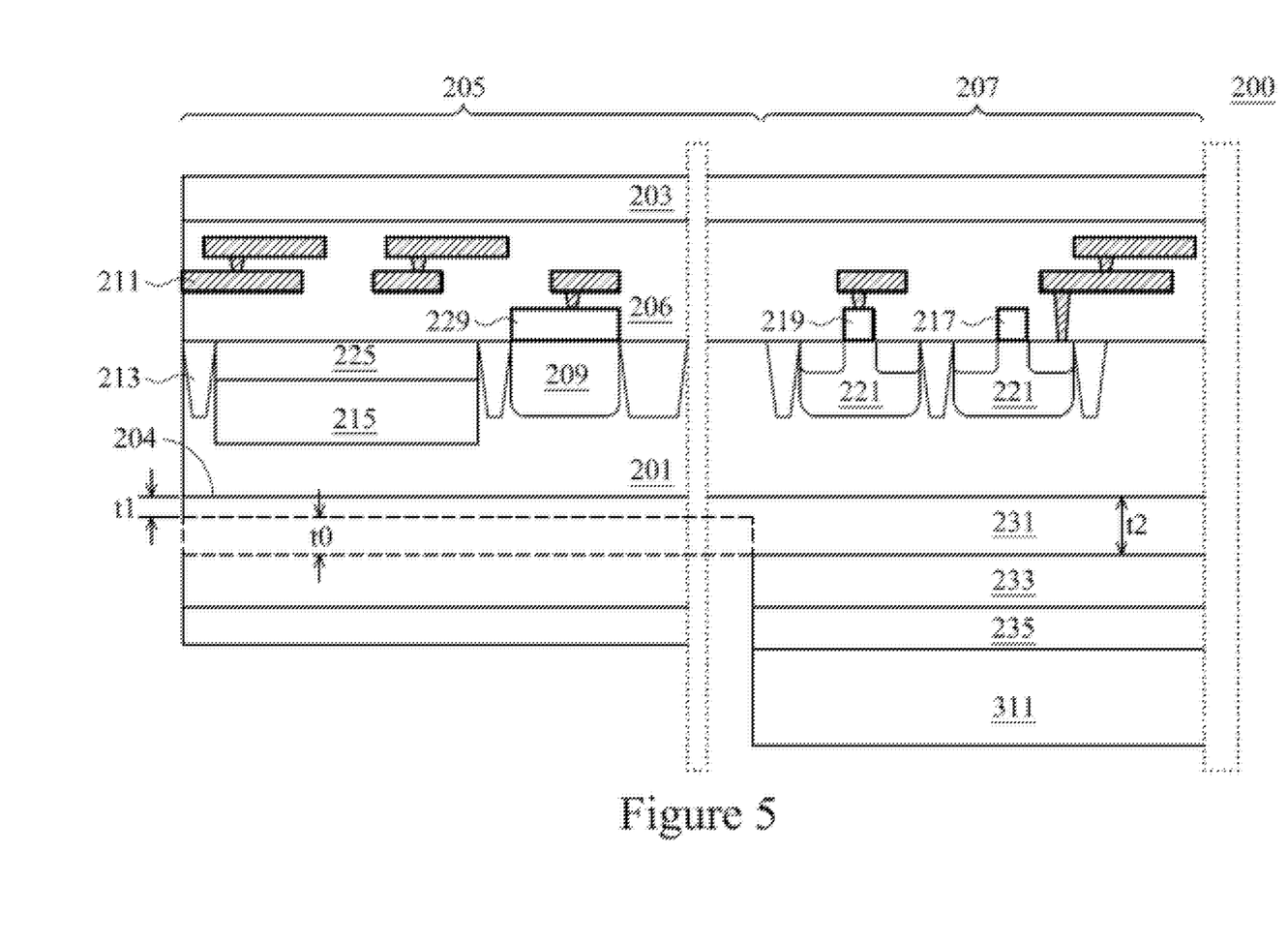
FIG. 5 illustrates in a cross sectional view the BSI image sensor device of FIG. 4 following additional processing steps.

FIG. 5 is another cross sectional view that further illustrates the device 200 of FIG. 4 and in particular shows the results of the over-etch of the BARC layer 231. The thickness t0 is the thickness of the BARC layer 231 that was removed by the etch process, and thickness t0 may be at least 10% of the thickness t2 of the BARC layer 231 over the periphery region 207, which is the thickness of the BARC layer 231 prior to the etching. The thickness t1 shown in FIG. 5 indicates the thickness of the BARC layer 231 remaining over the array region 205 after the etch process. The thickness t2 indicates the thickness of the BARC layer over the periphery region, i.e. the portions that have not been over etched. In illustrative embodiments, t1 may be 90% or less of t2.

Figure 6:
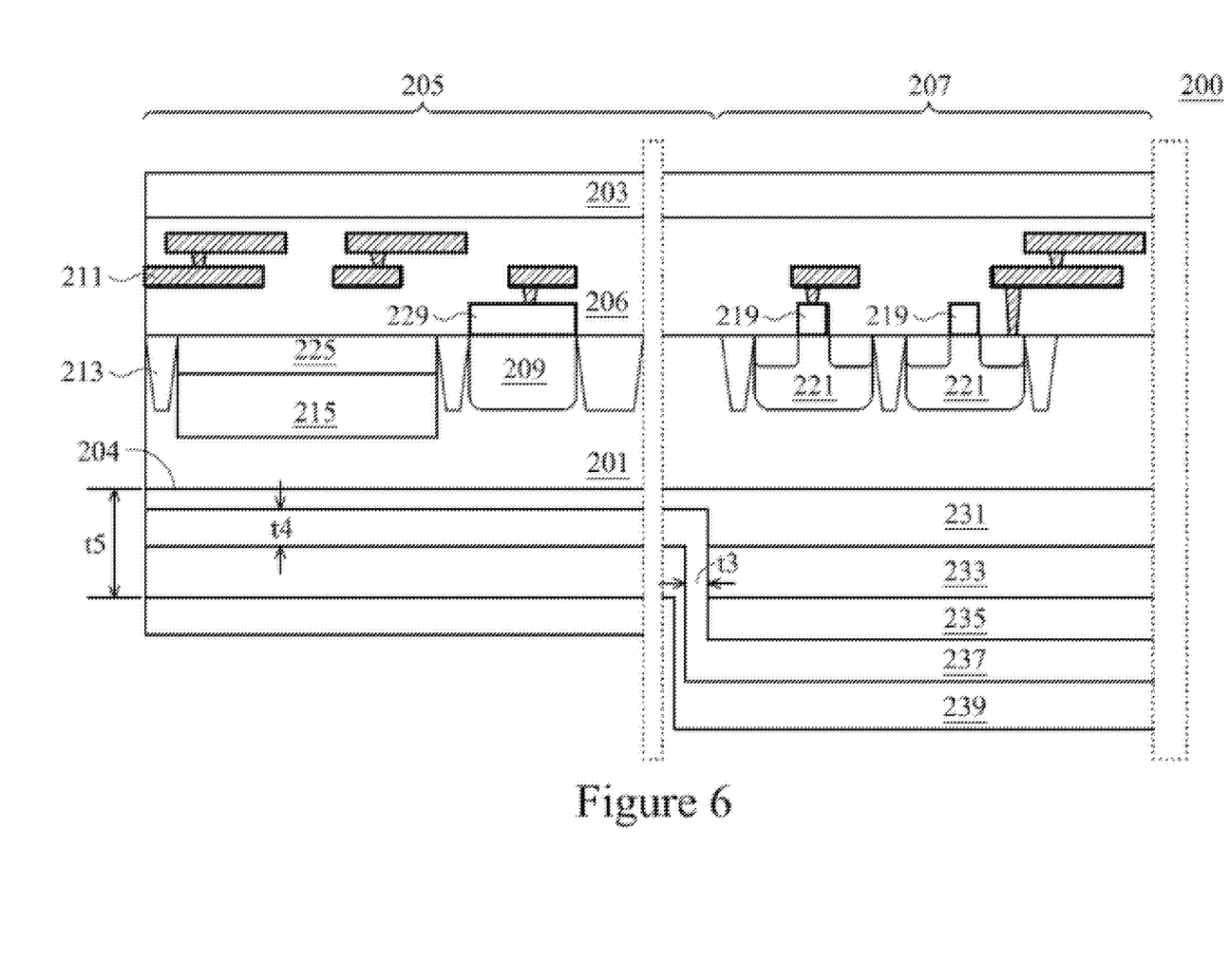
FIG. 6 illustrates in a cross sectional view the BSI image sensor device of FIG. 5 following additional processing steps.

FIG. 6 illustrates in another cross sectional view the embodiment image sensor device 200 following additional processing. After etch of the BARC layer 231 is completed as described above, a dielectric layer 237 is deposited over the back side 204 of the semiconductor substrate 201. The dielectric layer 237 may also be an oxide and this may be described as an oxide re-deposition step, as the layer 237 replaces the buffer oxide 233 removed from the sensor array region 205 by the above described etch processes. The dielectric layer 237 may be deposited by a CVD process. In the sensor array region 205, the oxide layer 237 now overlies the BARC layer 231. In the periphery region 207, the second dielectric or oxide layer 237 overlies the metal shield layer 235. The layer 237 also forms a thickness t3 on the vertical sidewall of the metal shield layer 235. Because this re-deposited oxide layer is deposited and is not then subsequently etched, a uniform thickness t4 of the layer 237 is easily obtained using known semiconductor processes. The thickness t4 of the layer 237 is highly uniform across the sensor array 205, across a particular integrated circuit die, and also across the entire semiconductor wafer. In contemplated embodiments, the thickness uniformity of layer 237 will vary by perhaps less than 7% over a semiconductor wafer.

In FIG. 6, t4 represents the thickness of the dielectric layer 237 on the surface of the BARC layer 231 (in the sensor array region 205) and the surface of the metal shield 235 (in the periphery region 207), i.e. the "horizontal" surfaces, whereas thickness t3 represents the thickness of the dielectric layer 237 on the vertical sidewall of the patterned layers (the metal shield layer 235, the buffer oxide layer 233, and the BARC layer 231 in the periphery region 207). In the contemplated embodiments, the ratio of t3/t4 is greater than about 40%.

In one example embodiment, the dielectric layer 237 is an oxide layer. While one skilled in the art will recognize various additional materials that could be employed for the dielectric film 237, examples include $SiO_2$, SiN, SiC, SiON, $Ta_2O_5$, $Al_2O_3$, HfO or more complex films that are formed by combinations of these components. By controlling the thickness of the second dielectric layer 237 through process control of the dielectric deposition, and by selection of the material, the thickness and properties of the materials over the back side 204 of the semiconductor substrate 201 can be controlled. These control parameters provide a tuning mechanism for tuning the image sensor in different applications, controlling the light mean value achieved.

Also shown in FIG. 6 is a passivation layer 239 deposited over the substrate. In the sensor array region 205, the passivation layer 239 is formed over the oxide layer 237 and the BARC layer 231. In the periphery region 207, the passivation layer 239 is formed over the oxide layer 237, the metal shield layer 235, the buffer oxide layer 233, and the BARC layer 231. The passivation layer may be silicon nitride, for example. The passivation layer 239 may be deposited by CVD, for example.

The thickness t5 in FIG. 6 represents the total film thickness above the array region 205, i.e., the remaining thickness of the BARC layer 231 after the over-etch described above, the thickness t4 of the dielectric film 237, and the thickness of the passivation layer 239. If thickness t5 is too low, the color light mean of the resulting image sensor cannot be tuned. On the other hand, if thickness t5 is too thick, it may induce color cross talk. While various thickness ranges for t5 are within the contemplated scope of the claims, illustrative embodiments may have a thickness t5 in the range of from about 500 Å to about 8000 Å.

Following the deposition of the passivation layer 239 as shown in FIG. 6, processing of the BSI image sensor will continue. Color filter structures and microlens devices (not shown) may be formed over the passivation layer 239 of BSI device 200. The color filter structures will selectively pass red, green and blue (R/G/B) frequency light onto corresponding photodiodes in the sensor array region 205, so that color pixel elements may be formed.

Figure 7:
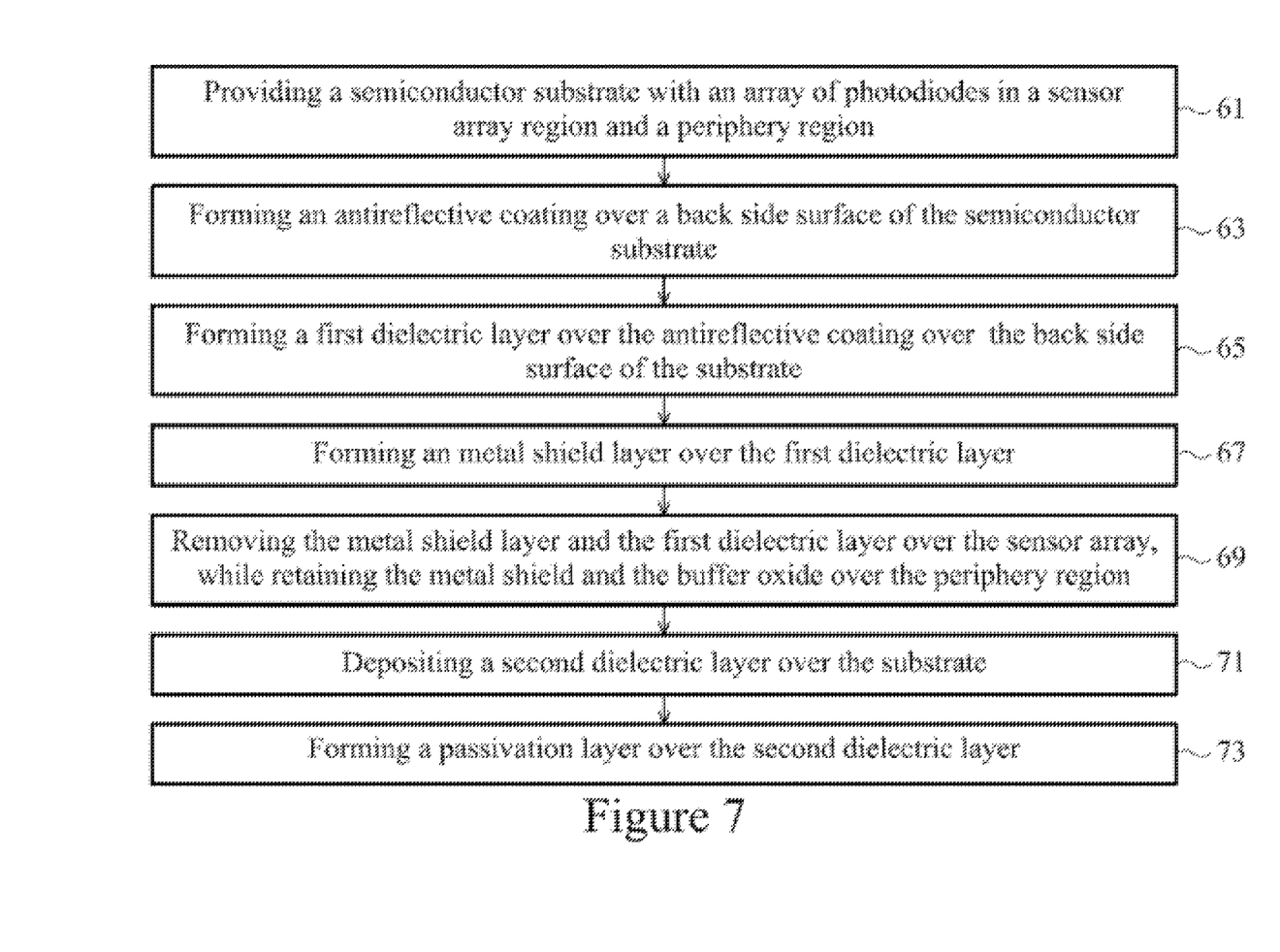
FIG. 7 illustrates method embodiment in a flow diagram.

FIG. 7 illustrates a method embodiment in a flow diagram. Beginning at stage 61, a semiconductor substrate is provided with a sensor array region of photodiodes and a periphery region of circuitry. At stage 63, an antireflective coating is formed over a back side of the semiconductor substrate. At stage 65, a first dielectric layer is formed over the antireflective coating. At stage 67, a metal shield layer is formed over the first dielectric layer.

At stage 69, a photolithographic pattern and etch process is used to selectively remove the metal shield layer and the buffer oxide layer from the BARC layer over the sensor array, while the metal shield and the buffer oxide layer are retained over the devices in the periphery region. The etch process is continued to remove a portion of the BARC layer over the sensor array region, so as to ensure the buffer oxide layer is completely removed from the BARC layer over the sensor array region.

At stage 71, a second dielectric layer, which may be an oxide layer, is formed over the substrate. In the sensor array region, the second dielectric layer is deposited over the BARC layer. In the periphery region, the second dielectric layer is over the metal shield layer.

At stage 73, a passivation layer is formed over the dielectric layer. The thickness of the passivation layer, the second dielectric layer, and the BARC layer over the back side of the semiconductor substrate is formed to a thickness that is in a range of from about 500 Angstroms to about 8000 Angstroms.

Figure 8:
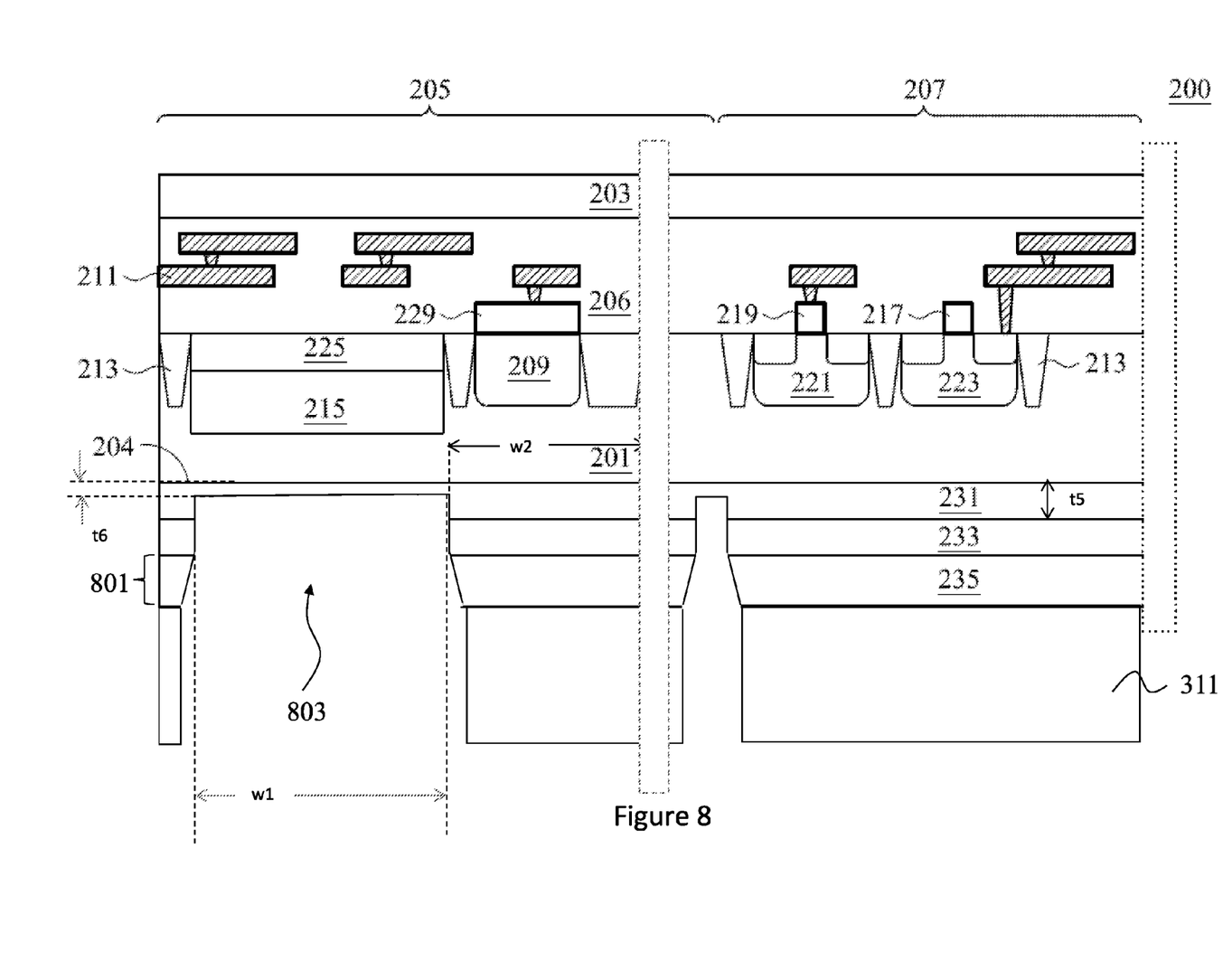
FIG. 8 illustrates in a cross sectional view of the BSI image sensor in an intermediate stage in the manufacture of another illustrative embodiment BSI image sensor device.

FIG. 8 illustrates another embodiment of forming structures over the back side 204 of the substrate 201. In this embodiment the photoresist layer 311 is placed over the metal shield layer 235 as described above with respect to FIG. 4. However, rather than patterning the photoresist layer 311 to remove the photoresist layer 311 from the sensor array region 205, the photoresist layer 311 is patterned to expose the metal shield layer 235 in a grid pattern over the sensor array region 205. Additionally, as in the previous embodiments, the photoresist layer 311 is patterned to remain in the periphery region 207.

Once the photoresist layer 311 has been patterned to expose the metal shield layer 235 in a grid pattern in the sensor array region 205, the photoresist layer 311 is used as a mask along with an etch process to selectively remove portions of the metal shield layer 235 that are exposed by the photoresist layer 311 in the grid pattern to form a metal shield grid 801. That is, a mask layer, such as the illustrated photoresist layer 311 or a hard mask layer or the like is formed over all or a portion of the periphery region 207, but forms the exposed grid pattern in the sensor array region 205. One skilled in the art will recognize how such a mask layer can be formed and patterned in this manner. Using one or more wet and/or dry etch processes, the metal shield layer 235 and the buffer oxide layer 233 are removed where the metal shield layer 235 has been exposed in the sensor array region 205, and any exposed portions of the periphery region 207. In an example embodiment, a dry etch is used.

The metal shield grid 801 may be formed to have openings 803 that align with and surround the edges of each of the photodiodes (e.g., diffusion region 215 in FIG. 8) while the metal shield grid 801 extends between edges of adjacent photodiodes. As such, the metal shield grid 801 will reflect light that comes in at an angle and direct it towards the appropriate photodiode, thereby preventing cross-talk between adjacent photodiodes. In an embodiment, the openings 803 have a width w1 that is sufficient to expose the photodiode while still preventing cross-talk. As such, while the width w1 of the opening 803 is dependent at least in part by the size of the photodiode, in some embodiments the width w1 may be between about 5 µm and about 0.5 µm, such as about 1 µm.

Additionally, while the metal shield grid 801 is described herein as a metal, any other suitable material may alternatively be utilized. For example, a material such as titanium nitride, silicon nitride, high-k materials such as tantalum oxide, hafnium oxide, or aluminum oxide may be used. All such materials are fully intended to be included within the scope of the embodiments.

In an embodiment the metal shield grid 801 extends from one photodiode to, e.g., an adjacent photodiode (not separately illustrated in FIG. 8). In such an embodiment the metal shield grid 801 will have a width w2 between the photodiodes that is different from and a percentage of the pixel pitch (e.g., the distance from an edge of one pixel to a similar edge of an adjacent pixel) of the device 200. For example, in an embodiment in which the pixel pitch is between about 0.6 µm and about 5.5 µm, such as about 1.1 µm, the width w2 of the metal shield grid 801 may be between about 5% and about 70%, such as about 9%, of the pixel pitch.

Additionally, as illustrated in FIG. 8, the etch process also removes a portion of the exposed regions of the BARC layer 231, such that the openings 803 extend through the metal shield layer 235, the buffer oxide layer 233, and a portion of the BARC layer 231. In contemplated embodiments, at least 10% of the original thickness of the BARC layer 231 in this embodiment will be removed in order to ensure that any remaining buffer oxide layer 233 in the exposed regions has been removed. As stated above, this is commonly referred to as an over-etch step or process. Removing a portion of the BARC layer 231 in this embodiment is done to completely remove the buffer oxide layer over the BARC layer 231 in the exposed portions of the sensor array area 205. In an example process, the etch continues until at least 10% of the original thickness of the BARC layer 231 is removed. In other embodiments, more than 10% of the original thickness of the BARC layer 231 may be removed by the over-etch process. The etch process will also form sidewalls in the oxide layer 233 and the metal shield layer 235, in which, in a particular embodiment, the sidewalls of the oxide layer 233 are vertical while the sidewalls in the metal shield layer 235 are angled.

The etch process removes a portion of the BARC layer 231, such that the BARC layer 231 in this embodiment has a remaining thickness t6 while the BARC layer 231 remaining in the periphery region 207 and over non-exposed regions of the sensor array area 205 retain the thickness t5. In an embodiment the thickness t6 may be 90% or less of the thickness t5. In other words, the thickness of the portion of the BARC layer 231 that is removed by the etch process is at least 10% of the original thickness t5 of the BARC layer 231 in this embodiment.

Figure 9:
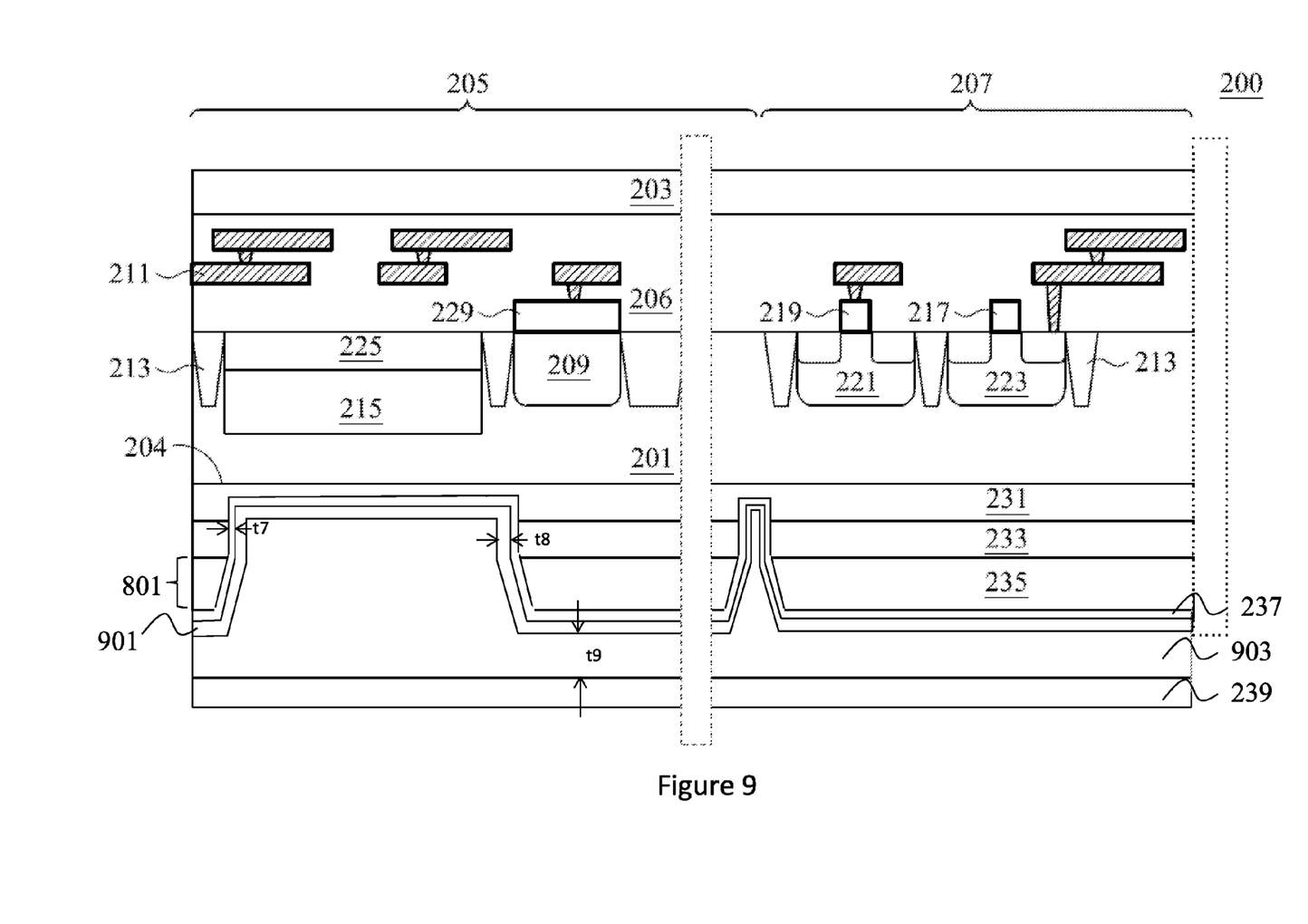
FIG. 9 illustrates in a cross sectional view the BSI image sensor device of FIG. 8 following additional processing steps.

FIG. 9 illustrates in another cross sectional view the embodiment image sensor device 200 following additional processing. After the etch of the BARC layer 231 is completed as described above with respect to FIG. 8, the dielectric layer 237 is deposited over the back side 204 of the semiconductor substrate 201. In this embodiment the dielectric layer 237 may also be an oxide and this may be described as an oxide re-deposition step, as the layer 237 replaces those portions of the buffer oxide 233 that were removed during the previous etch process. The dielectric layer 237 may be deposited by a CVD process.

In the periphery region 207, the dielectric layer 237 overlies the metal shield layer 235. However, in the sensor array region 205, the dielectric layer 237 fills a portion of the openings 803 between the metal shield grid 801, covering the sidewalls of the BARC layer 231, the oxide layer 233, and the metal shield layer 235 that were formed during the etch process. Additionally, the dielectric layer 237 also overlies those portions of the metal shield layer 235 in the sensor array region 205 that were not removed during the etch process.

Over the sidewalls of the BARC layer 231 and the oxide layer 233, the dielectric layer 237 in this embodiment can have a thickness t7. In an embodiment this thickness t7 of the dielectric layer 237 will be a percentage of the overall width w1 of the opening into which the dielectric layer 237 is placed. In a particular embodiment the thickness t7 of the dielectric layer 233 is less than about 50% of the width w1 of the opening 803, although any other suitable thickness may alternatively be utilized. For example, in an embodiment in which the openings 803 have the width w1 of between about 5 µm and about 0.5 µm, the dielectric layer 237 will have a thickness t7 of between about 2.4 µm and about 0.01 µm, such as about 0.1 µm.

In one example, the dielectric layer 237 is an oxide layer. While one skilled in the art will recognize various additional materials that could be employed for the dielectric film 237, examples include $SiO_2$, SiN, SiC, SiON, $Ta_2O_5$, $Al_2O_3$, HfO or more complex films that are formed by combinations of these components. By controlling the thickness of the second dielectric layer 237 through process control of the dielectric deposition, and by selection of the material, the thickness and properties of the materials over the back side 204 of the semiconductor substrate 201 can be controlled. These control parameters provide a tuning mechanism for tuning the image sensor in different applications, controlling the light mean value achieved.

Also shown in FIG. 9 is a formation of a second dielectric layer 901 and, optionally, a third dielectric layer 903. In an embodiment the dielectric layer 237, the second dielectric layer 901 and the third dielectric layer 903 may be utilized together in order to improve the quantum efficiency of the performance of the device 200. For example, in an embodiment the dielectric layer 237, the second dielectric layer 901, and the third dielectric layer 903 may have different refractive indexes, such as between about 1 and about 6, in order to shift and control incoming light as desired to focus the incoming light more fully on the photodiode. By utilizing both the metal shield grid 801 (to prevent cross-talk) along with the focusing ability of the dielectric layers (e.g., the dielectric layer 237 and the second dielectric layer 901, to focus the light more directly onto the photodiode), the overall efficiency of the device 200 can be improved beyond using the metal shield grid 801 by itself.

In a particular embodiment the second dielectric layer 901 may be a material with a different refractive index than the dielectric layer 237. For example, in an embodiment in which the dielectric layer 237 is 1.75, the second dielectric layer 901 may be, e.g., 1.88, although any other suitable material, such as $SiO_2$, SiN, SiC, SiON, $Ta_2O_5$, $Al_2O_3$, HfO or more complex films that are formed by combinations of these components, may alternatively be utilized. In such an embodiment the second dielectric layer 237 may be formed using, e.g., chemical vapor deposition, although any suitable method of formation may be used, to a thickness t8 of between about 0.1 µm and about 4.96 µm, such as about 0.5 µm.

The third dielectric layer 903 may be a material with a refractive index that is different from the second dielectric layer 901. For example, in an embodiment in which the second dielectric layer 901 is 1.88, the third dielectric layer 903 may be a material with a refractive index of 1.55, although any suitable material, such as $SiO_2$, SiN, SiC, SiON, $Ta_2O_5$, $Al_2O_3$, HfO or more complex films that are formed by combinations of these components, may alternatively be utilized. In such an embodiment the third dielectric layer 903 may be formed using, e.g., chemical vapor deposition, although any suitable method of formation may be used, to a thickness t9 sufficient to fill and/or overfill the openings 803. In a particular embodiment the third dielectric layer 903 may have the thickness t9 over the second dielectric layer 901 of between about 0.01 µm and about 10 µm, such as about 0.5 µm.

However, as one of ordinary skill in the art will recognize, the second dielectric layer 901 and the third dielectric layer 903 are not the only two dielectric layers that may be utilized to fill and overfill the openings 803. Rather, any suitable number of dielectric layers, such as the second dielectric layer 901 by itself or three or more individual dielectric layers, may alternatively be utilized, wherein the sum of thickness for all of the dielectric layers except for the dielectric layer 237 is less than 100% of the width w1 of the openings 803 so that the dielectric layer 237, the second dielectric layer 901, the third dielectric layer 903, and any other desired dielectric layer collectively fill and/or overfill the openings 803.

Optionally, once the second dielectric layer 901, the third dielectric layer 903, and any other desired dielectric layers have been formed to fill and/or overfill the openings 803, the top surface of the dielectric layers may be planarized. In an embodiment in which the second dielectric layer 901 and the third dielectric layer 903 are used to fill and overfill the openings 803, the third dielectric layer 903 may be planarized using a process such as a chemical mechanical polishing (CMP) in order to provide a planar surface for incoming light to pass through while minimizing undesired refractions from a non-planar surface.

Also shown in FIG. 9 is the passivation layer 239 deposited over the substrate 201. In the sensor array region 205, the passivation layer 239 is formed over the dielectric layer 237, the second dielectric layer 901 (and, if present, the third dielectric layer 903), the buffer oxide layer 233, the metal grid 801, and the BARC layer 231. In the periphery region 207, the passivation layer 239 is formed over the dielectric layer 237, the second dielectric layer 901 (and, if present, the third dielectric layer 903), the metal shield layer 235, the buffer oxide layer 233, and the BARC layer 231. The passivation layer may be silicon nitride, for example. The passivation layer 239 may be deposited by CVD, for example.

By utilizing the metal shield grid 801 to frame the pixels and the photodiodes, the metal shield grid 801 can direct light towards the photodiode, thereby reducing or eliminating the amount of cross-talk between adjacent pixels. Additionally, by utilizing dielectric layers with different refractive indexes (e.g., the dielectric layer 237 and the second dielectric layer 901), these layers may be used to focus incoming light onto the photodiode. Using both the metal shield grid 801 and the dielectric layers together will improve the overall efficiency of the device 200, increasing the quantum efficiency (QE), the signal to noise ratio (SNR), and the light mean uniformity and value while enabling the fine tuning of the Red/Green/Blue light mean ratio.

Following the deposition of the passivation layer 239 as shown in FIG. 9, processing of the BSI image sensor will continue. Color filter structures and microlens devices (not shown) may be formed over the passivation layer 239 of BSI device 200. The color filter structures will selectively pass red, green and blue (R/G/B) frequency light onto corresponding photodiodes in the sensor array region 205, so that color pixel elements may be formed.

Use of the embodiments results in a dielectric layer over a sensor array of photodiodes that has a uniform thickness. Further, the thickness of the layers over the sensor array and the material used may be controlled, and thus, the light path to the photodiodes in the sensor array may be tuned. This is in sharp contrast to the prior approaches. The R/G/B light mean ratio for the image sensor may be fine-tuned. The light mean uniformity and light mean value may be improved, as well as the QE and the SNR. The processes used in the embodiments are conventional semiconductor processes that are readily available and easily extended to future process nodes.

In an embodiment, a method for forming an image sensor includes providing a semiconductor substrate having a sensor array region and a periphery region and having a front side surface and an opposing back side surface; forming a bottom anti-reflective coating (BARC) over the back side surface of the semiconductor substrate to a first thickness, over the sensor array region and the periphery region; forming a first dielectric layer over the BARC; forming a metal shield over the first dielectric layer; selectively removing the metal shield from over the sensor array region; selectively removing the first dielectric layer from over the sensor array region, wherein a portion of the first thickness of the BARC is also removed and a remainder of the first thickness of the BARC remains, during the selectively removing the first dielectric layer; forming a second dielectric layer over the remainder of the first thickness of the BARC and over the metal shield over the periphery region; and forming a passivation layer over the second dielectric layer. In a further embodiment, in the above method the portion of the first thickness of the BARC removed is at least about 10% of the first thickness. In still another embodiment in the above method, the portion of the BARC that remains has a thickness that is less than about 90% of the first thickness. In yet another embodiment, in the above methods, forming the first dielectric layer includes forming buffer oxide.

In yet another embodiment, the above method further includes forming the second dielectric layer including depositing one selected from the group consisting essentially of $SiO_2$, SiN, SiC, SiON, $Ta_2O_5$, $Al_2O_3$, HfO, and a complex film formed by combinations of these components. In still a further embodiment, in the above method, forming the second dielectric layer includes depositing one selected from the group consisting essentially of $SiO_2$, SiN, SiC, SiON, $Ta_2O_5$, $Al_2O_3$, HfO, and a layer formed of combinations of these.

In still a further embodiment, in the above methods, following the forming of the passivation layer, a total thickness of the remainder of the first thickness of the BARC, the second dielectric layer, and the passivation layer over the sensor array region ranges from about 500 Å to about 8000 Å. In yet another embodiment, in the above method, forming the second dielectric layer includes forming a second dielectric layer that has a thickness that varies less than 7% in uniformity. In yet another embodiment, in the above method, the periphery region further includes CMOS transistors. In still another embodiment, the above methods include wherein a portion of the second dielectric layer formed over the sensor array region has a third thickness and a portion of the second dielectric layer formed on a vertical sidewall of the metal shield after the selectively removing has a fourth thickness, and a ratio of the fourth thickness to the third thickness is greater than about 40%. In yet another embodiment, the above methods include wherein the selectively removing comprises performing a dry etch process, while the periphery region is protected by a photoresist layer.

In another embodiment, a BSI image sensor includes a semiconductor substrate having a sensor array region and a periphery region formed in the semiconductor substrate, and having a front side surface and a back side surface; a plurality of metallization layers formed in a dielectric layer overlying the front side surface of the semiconductor substrate; a BARC layer formed over the back side surface of the semiconductor substrate having a first thickness over the sensor array region, and a second greater thickness over the periphery region; a first dielectric layer formed over the BARC layer in the periphery region; a metal shield layer formed over the first dielectric layer in the periphery region; a second dielectric layer formed over the back side of the semiconductor substrate over the first thickness of the BARC layer over the sensor array region, and over the metal shield over the periphery region; and a passivation layer formed over the second dielectric layer; wherein a total thickness of the BARC layer, the second dielectric layer, and the passivation layer over the sensor array region ranges from about 500 Å to about 8000 Å.

In another embodiment, the BSI image sensor is provided wherein the first dielectric layer comprises a buffer oxide. In still a further embodiment, in the BSI image sensor above, the second dielectric layer includes one selected from the group consisting essentially of $SiO_2$, SiN, SiC, SiON, $Ta_2O_5$, $Al_2O_3$, HfO, and a complex film formed by combinations of these components. In a further embodiment, the BSI image sensor is provided wherein the second dielectric layer an oxide layer. In yet another embodiment, the BSI image sensor is provided and the second dielectric layer has a thickness over sensor array region that is a first thickness, and a thickness over a vertical sidewall of the metal shield over the periphery region that is a second thickness, and a ratio of the second thickness to the first thickness is greater than about 40%. In still a further embodiment, the BSI image sensor is provided wherein the first thickness of the BARC layer is less than about 90% of the second thickness of the BARC layer. In yet another embodiment, the BSI image sensor is provided wherein the wherein the second dielectric layer has a thickness that varies less than 7% in uniformity.

In yet another embodiment, a BSI image sensor is provided including a semiconductor substrate having a front side surface and a back side surface; a plurality of photodiodes formed in a sensor array region of the semiconductor substrate; a plurality of CMOS transistors formed in a periphery region adjacent the sensor array region of the semiconductor substrate; a BARC layer overlying the back side surface of the semiconductor substrate having a first thickness in the sensor array region and a second thickness greater than the first thickness in the periphery region; a buffer oxide layer overlying the BARC layer in the periphery region but not in the sensor array region; a metal shield layer overlying the buffer oxide layer in the periphery region; a second dielectric layer overlying the BARC layer in the sensor array region and overlying the metal shield layer in the periphery region, the second dielectric layer being one selected from the group consisting essentially of $SiO_2$, SiN, SiC, SiON, $Ta_2O_5$, $Al_2O_3$, HfO, and a complex film formed by combinations of these components; and a passivation layer over the second dielectric layer. In a further embodiment, the BSI image sensor includes wherein a total thickness of the first thickness of the BARC layer, the second dielectric layer, and the passivation layer over the sensor array region ranges from about 500 Å to about 8000 Å.

In yet another embodiment a method of manufacturing an image sensor comprising providing a semiconductor substrate having a sensor array region and a periphery region and having a front side and an opposing back side surface is provided. A bottom anti-reflective coating (BARC) layer is formed over the back side surface of the semiconductor substrate to a first thickness, over the sensor array region and the periphery region and a metal shield layer is formed over the BARC layer. Portions of the metal shield layer are selectively removed from over the sensor array region to form a metal shield grid over the sensor array region. Portions of the BARC layer exposed by the selectively removing the metal shield are selectively removed, wherein a portion of the first thickness of the BARC layer is also removed and a remainder of the first thickness of the BARC layer remains during the selectively removing the portions of the metal shield layer. A first dielectric layer is formed within the metal shield grid over the sensor array region and over a remainder of the first thickness of the BARC layer over the periphery region, and a second dielectric layer is formed within the metal shield grid, the second dielectric layer having a different refractive index than the first dielectric layer.

In yet another embodiment a back side image sensor comprising a semiconductor substrate with a first side and a second side, the semiconductor substrate comprising a pixel region and a periphery region is provided. A BARC layer is located on the second side, the BARC layer having a first region with a first thickness in the periphery region and a second region with a second thickness in the pixel region, the second thickness being less than the first thickness. A metal shield grid is located over the BARC layer, wherein the metal shield grid comprises a first opening through the metal shield grid, the first opening located over the second region. A first dielectric layer covers sidewalls of the first opening, the first dielectric layer having a first refractive index, and a second dielectric layer is adjacent to the first dielectric layer, the second dielectric layer having a second refractive index different from the first refractive index.

In yet another embodiment, a back side image sensor comprising a substrate with a pixel region and a periphery region is provided. A BARC layer is adjacent to a first side of the substrate in both the pixel region and the periphery region and a metal shield layer is opposite the BARC layer from the substrate. A first opening is over the pixel region, wherein the first opening extends all of the way through the metal shield layer and extends through a portion of the BARC layer. A first dielectric layer is lining sidewalls of the first opening and filling a first portion of the first opening, and a second dielectric layer is adjacent to the first dielectric layer and filling a second portion of the first opening, wherein the second dielectric layer has a refractive index different from the first dielectric layer.

While the embodiments are described herein with reference to illustrative embodiments, this description is not intended to be construed in a limiting sense. Various modifications and combinations of the illustrative embodiments, as well as other embodiments, will be apparent to persons skilled in the art upon reference to the description. For example, although in the illustrative embodiments CMOS photodiodes are described as the photosensitive elements, CCD devices could also be used. It is therefore intended that the appended claims encompass any such modifications or embodiments.

What is claimed is:

1. A method of manufacturing an image sensor, the method comprising:
   providing a semiconductor substrate having a sensor array region and a periphery region and having a front side and an opposing back side surface;
   forming a bottom anti-reflective coating (BARC) layer over the back side surface of the semiconductor substrate to a first thickness over the sensor array region and the periphery region;
   forming a metal shield layer over the BARC layer;
   selectively removing portions of the metal shield layer from over the sensor array region to form a metal shield grid over the sensor array region;
   selectively removing portions of the BARC layer exposed by the selectively removing the metal shield layer, wherein a portion of the first thickness of the BARC layer is also removed and a remainder of the first thickness of the BARC layer remains during the selectively removing the portions of the metal shield layer;
   forming a first dielectric layer within the metal shield grid over the sensor array region and over a remainder of the first thickness of the BARC layer over the periphery region; and
   forming a second dielectric layer within the metal shield grid, the second dielectric layer having a different refractive index than the first dielectric layer.

2. The method of claim 1, further comprising forming a third dielectric layer over the second dielectric layer within the metal shield grid over the sensor array region.

3. The method of claim 2, wherein the third dielectric layer has a different refractive index than the second dielectric layer.

4. The method of claim 3, further comprising forming a passivation layer over the third dielectric layer.

5. The method of claim 1, wherein the first dielectric layer and the second dielectric layer fill a region within the metal shield grid.

6. The method of claim 1, wherein the metal shield grid has a width that is between 5% and 70% of a pixel pitch of the image sensor.

7. The method of claim 1, wherein the second dielectric layer has a first thickness along a sidewall of the metal shield grid that is less than 50% of a width from a first surface of the metal shield grid to a second surface of the metal shield grid, the first surface facing the second surface.

8. A method of manufacturing an image sensor, the method comprising:
   forming a BARC layer and a grid layer over an array region of a substrate and a periphery region of the substrate;
   forming an opening in the BARC layer and the grid layer, wherein the opening is confined to over the array region, wherein the opening extends fully through the grid layer and extends partially through the BARC layer;
   forming a first dielectric layer lining the opening and extending over the periphery region; and forming a second dielectric layer within the opening, the second dielectric layer having a different refractive index than the first dielectric layer.

9. The method of claim 8, wherein the grid layer comprises a metal.

10. The method of claim 9, wherein the metal comprises tungsten, aluminum, or copper.

11. The method of claim 8, wherein the grid layer comprises titanium nitride, silicon nitride, tantalum oxide, hafnium oxide, or aluminum oxide.

12. The method of claim 8, wherein the forming the opening forms a grid.

13. The method of claim 12, wherein the grid has sidewalls aligned with photodiodes located within the substrate.

14. The method of claim 13, wherein the grid has a width that is between about 5% and about 70% of a pixel pitch of the image sensor.

15. A method of manufacturing an image sensor, the method comprising:
- manufacturing a sensor array and a periphery region on a semiconductor substrate;
- depositing a BARC layer with a first thickness over the sensor array and the periphery region;
- depositing a metal layer with a second thickness over the BARC layer and over both the sensor array and the periphery region;
- forming a metal grid by removing portions of the metal layer over the sensor array to form one or more openings, each of the one or more openings having a depth larger than the second thickness, wherein the metal layer over the periphery region remains at the second thickness; and
- lining the one or more openings with a first dielectric layer, wherein the first dielectric layer extends from the one or more openings to a point over the periphery region.

16. The method of claim 15, wherein the first dielectric layer has a uniform thickness.

17. The method of claim 15, wherein a uniformity of the first dielectric layer varies less than 7%.

18. The method of claim 15, wherein the metal grid has a width of between about 5 µm and about 0.5 µm.

19. The method of claim 15, wherein the first dielectric layer has a first thickness over the periphery region and a second thickness on sidewalls of the one or more openings, and wherein a ratio of the second thickness to the first thickness is greater than about 40%.

20. The method of claim 15, wherein the one or more openings have vertical sidewalls.

* * * * *